United States Patent
Shi et al.

(10) Patent No.: US 9,844,158 B2
(45) Date of Patent: Dec. 12, 2017

(54) BATTERY COVER LOCKING MECHANISM OF A MOBILE TERMINAL AND METHOD OF MANUFACTURING THE SAME

(71) Applicant: Honeywell International, Inc., Morris Plains, NJ (US)

(72) Inventors: Wei Shi, Suzhou (CN); Wei Li, Huizhou (CN); Kop Liu, Huizhou (CN); Yeqi Liu, Shenzhen (CN); Chuanfang Wang, Shenzhen (CN); Jingo Zhao, Shenzhen (CN)

(73) Assignee: Honeywell International, Inc., Morris Plains, NJ (US)

( * ) Notice: Subject to any disclaimer, the term of this patent is extended or adjusted under 35 U.S.C. 154(b) by 0 days.

(21) Appl. No.: 15/381,311

(22) Filed: Dec. 16, 2016

(65) Prior Publication Data
US 2017/0181299 A1    Jun. 22, 2017

(30) Foreign Application Priority Data
Dec. 18, 2015  (CN) .......................... 2015 1 0951828

(51) Int. Cl.
*H05K 5/02* (2006.01)
*H05K 5/03* (2006.01)

(52) U.S. Cl.
CPC ......... *H05K 5/0221* (2013.01); *H05K 5/0256* (2013.01); *H05K 5/03* (2013.01)

(58) Field of Classification Search
None
See application file for complete search history.

(56) References Cited

U.S. PATENT DOCUMENTS

| 6,832,725 B2 | 12/2004 | Gardiner et al. |
| 7,128,266 B2 | 10/2006 | Zhu et al. |

(Continued)

FOREIGN PATENT DOCUMENTS

| WO | 2013163789 A1 | 11/2013 |
| WO | 2013173985 A1 | 11/2013 |

(Continued)

OTHER PUBLICATIONS

Combined Search and Examination Report in related UK Application No. GB1621478.5 dated May 4, 2017, pp. 1-5.

(Continued)

*Primary Examiner* — Xanthia C Cunningham
(74) *Attorney, Agent, or Firm* — Additon, Higgins & Pendleton, P.A.

(57) ABSTRACT

The present invention provides a locking mechanism in a mobile terminal and method of manufacturing the same. The locking mechanism comprises a lock button, a slide latch, and spring member. The slide latch may slide between a first position and a second position and comprises a hole and snaps, the hole is on the top of the slide latch and extends through the slide latch, the snaps are at the front side of the slide latch. The lock button is in the hole and comprises a press part and a support part, the support part being connected to the press part and extending downward from the press part through the hole to be in contact with the contact part on the spring member; the spring member is fixed with the slide latch and comprises an spring reaction part, a contact part and a protrusion part, the contact part being in contact with the support part of the lock button and a force from the support part causing a spring deformation in the spring reaction part.

10 Claims, 7 Drawing Sheets

(56) References Cited

U.S. PATENT DOCUMENTS

| | | | |
|---|---|---|---|
| 7,159,783 B2 | 1/2007 | Walczyk et al. | |
| 7,413,127 B2 | 8/2008 | Ehrhart et al. | |
| 7,441,813 B2 * | 10/2008 | Qin | H04B 1/3883 292/163 |
| 7,630,742 B2 * | 12/2009 | Park | G06F 1/1613 455/128 |
| 7,726,575 B2 | 6/2010 | Wang et al. | |
| 7,751,181 B2 * | 7/2010 | Chen | H01M 2/1066 361/679.01 |
| 7,789,439 B2 * | 9/2010 | Zhao | H01M 2/1066 292/137 |
| 7,842,412 B2 * | 11/2010 | Zhang | H01M 2/1066 429/163 |
| 7,892,668 B2 * | 2/2011 | Choi | H01M 2/1066 429/100 |
| 7,986,524 B2 * | 7/2011 | Dong | G06F 1/1626 312/223.1 |
| 8,085,530 B2 * | 12/2011 | Zhang | G06F 1/187 211/26 |
| 8,094,439 B2 * | 1/2012 | Lin | H01M 2/1066 361/679.01 |
| 8,102,645 B2 * | 1/2012 | Zhang | H01H 9/00 361/679.01 |
| 8,293,401 B2 * | 10/2012 | Li | H01M 2/1066 429/163 |
| 8,294,969 B2 | 10/2012 | Plesko | |
| 8,317,105 B2 | 11/2012 | Kotlarsky et al. | |
| 8,322,622 B2 | 12/2012 | Liu | |
| 8,366,005 B2 | 2/2013 | Kotlarsky et al. | |
| 8,371,507 B2 | 2/2013 | Haggerty et al. | |
| 8,376,233 B2 | 2/2013 | Van Horn et al. | |
| 8,381,979 B2 | 2/2013 | Franz | |
| 8,390,909 B2 | 3/2013 | Plesko | |
| 8,408,464 B2 | 4/2013 | Zhu et al. | |
| 8,408,468 B2 | 4/2013 | Horn et al. | |
| 8,408,469 B2 | 4/2013 | Good | |
| 8,409,739 B2 * | 4/2013 | Ouyang | H01M 2/1066 429/100 |
| 8,424,768 B2 | 4/2013 | Rueblinger et al. | |
| 8,448,863 B2 | 5/2013 | Xian et al. | |
| 8,450,003 B2 * | 5/2013 | Ouyang | H01M 2/00 429/100 |
| 8,457,013 B2 | 6/2013 | Essinger et al. | |
| 8,459,557 B2 | 6/2013 | Havens et al. | |
| 8,469,272 B2 | 6/2013 | Kearney | |
| 8,474,712 B2 | 7/2013 | Kearney et al. | |
| 8,479,992 B2 | 7/2013 | Kotlarsky et al. | |
| 8,490,877 B2 | 7/2013 | Kearney | |
| 8,517,271 B2 | 8/2013 | Kotlarsky et al. | |
| 8,523,076 B2 | 9/2013 | Good | |
| 8,528,818 B2 | 9/2013 | Ehrhart et al. | |
| 8,544,737 B2 | 10/2013 | Gomez et al. | |
| 8,548,420 B2 | 10/2013 | Grunow et al. | |
| 8,550,335 B2 | 10/2013 | Samek et al. | |
| 8,550,354 B2 | 10/2013 | Gannon et al. | |
| 8,550,357 B2 | 10/2013 | Kearney | |
| 8,556,174 B2 | 10/2013 | Kosecki et al. | |
| 8,556,176 B2 | 10/2013 | Van Horn et al. | |
| 8,556,177 B2 | 10/2013 | Hussey et al. | |
| 8,559,767 B2 | 10/2013 | Barber et al. | |
| 8,561,895 B2 | 10/2013 | Gomez et al. | |
| 8,561,903 B2 | 10/2013 | Sauerwein | |
| 8,561,905 B2 | 10/2013 | Edmonds et al. | |
| 8,565,107 B2 | 10/2013 | Pease et al. | |
| 8,571,307 B2 | 10/2013 | Li et al. | |
| 8,579,200 B2 | 11/2013 | Samek et al. | |
| 8,583,924 B2 | 11/2013 | Caballero et al. | |
| 8,584,945 B2 | 11/2013 | Wang et al. | |
| 8,587,595 B2 | 11/2013 | Wang | |
| 8,587,697 B2 | 11/2013 | Hussey et al. | |
| 8,588,869 B2 | 11/2013 | Sauerwein et al. | |
| 8,590,789 B2 | 11/2013 | Nahill et al. | |
| 8,596,539 B2 | 12/2013 | Havens et al. | |
| 8,596,542 B2 | 12/2013 | Havens et al. | |
| 8,596,543 B2 | 12/2013 | Havens et al. | |
| 8,599,271 B2 | 12/2013 | Havens et al. | |
| 8,599,957 B2 | 12/2013 | Peake et al. | |
| 8,600,158 B2 | 12/2013 | Li et al. | |
| 8,600,167 B2 | 12/2013 | Showering | |
| 8,602,309 B2 | 12/2013 | Longacre et al. | |
| 8,608,053 B2 | 12/2013 | Meier et al. | |
| 8,608,071 B2 | 12/2013 | Liu et al. | |
| 8,611,309 B2 | 12/2013 | Wang et al. | |
| 8,615,487 B2 | 12/2013 | Gomez et al. | |
| 8,621,123 B2 | 12/2013 | Caballero | |
| 8,622,303 B2 | 1/2014 | Meier et al. | |
| 8,628,013 B2 | 1/2014 | Ding | |
| 8,628,015 B2 | 1/2014 | Wang et al. | |
| 8,628,016 B2 | 1/2014 | Winegar | |
| 8,629,926 B2 | 1/2014 | Wang | |
| 8,630,491 B2 | 1/2014 | Longacre et al. | |
| 8,635,309 B2 | 1/2014 | Berthiaume et al. | |
| 8,636,200 B2 | 1/2014 | Kearney | |
| 8,636,212 B2 | 1/2014 | Nahill et al. | |
| 8,636,215 B2 | 1/2014 | Ding et al. | |
| 8,636,224 B2 | 1/2014 | Wang | |
| 8,638,806 B2 | 1/2014 | Wang et al. | |
| 8,640,958 B2 | 2/2014 | Lu et al. | |
| 8,640,960 B2 | 2/2014 | Wang et al. | |
| 8,643,717 B2 | 2/2014 | Li et al. | |
| 8,646,692 B2 | 2/2014 | Meier et al. | |
| 8,646,694 B2 | 2/2014 | Wang et al. | |
| 8,657,200 B2 | 2/2014 | Ren et al. | |
| 8,659,397 B2 | 2/2014 | Vargo et al. | |
| 8,668,149 B2 | 3/2014 | Good | |
| 8,678,285 B2 | 3/2014 | Kearney | |
| 8,678,286 B2 | 3/2014 | Smith et al. | |
| 8,682,077 B1 | 3/2014 | Longacre | |
| D702,237 S | 4/2014 | Oberpriller et al. | |
| 8,687,282 B2 | 4/2014 | Feng et al. | |
| 8,692,927 B2 | 4/2014 | Pease et al. | |
| 8,695,880 B2 | 4/2014 | Bremer et al. | |
| 8,698,949 B2 | 4/2014 | Grunow et al. | |
| 8,702,000 B2 | 4/2014 | Barber et al. | |
| 8,717,494 B2 | 5/2014 | Gannon | |
| 8,720,783 B2 | 5/2014 | Biss et al. | |
| 8,723,804 B2 | 5/2014 | Fletcher et al. | |
| 8,723,904 B2 | 5/2014 | Marty et al. | |
| 8,727,223 B2 | 5/2014 | Wang | |
| 8,740,082 B2 | 6/2014 | Wilz | |
| 8,740,085 B2 | 6/2014 | Furlong et al. | |
| 8,746,563 B2 | 6/2014 | Hennick et al. | |
| 8,750,445 B2 | 6/2014 | Peake et al. | |
| 8,752,766 B2 | 6/2014 | Xian et al. | |
| 8,756,059 B2 | 6/2014 | Braho et al. | |
| 8,757,495 B2 | 6/2014 | Qu et al. | |
| 8,760,563 B2 | 6/2014 | Koziol et al. | |
| 8,763,909 B2 | 7/2014 | Reed et al. | |
| 8,777,108 B2 | 7/2014 | Coyle | |
| 8,777,109 B2 | 7/2014 | Oberpriller et al. | |
| 8,779,898 B2 | 7/2014 | Havens et al. | |
| 8,781,520 B2 | 7/2014 | Payne et al. | |
| 8,783,573 B2 | 7/2014 | Havens et al. | |
| 8,789,757 B2 | 7/2014 | Barten | |
| 8,789,758 B2 | 7/2014 | Hawley et al. | |
| 8,789,759 B2 | 7/2014 | Xian et al. | |
| 8,794,520 B2 | 8/2014 | Wang et al. | |
| 8,794,522 B2 | 8/2014 | Ehrhart | |
| 8,794,525 B2 | 8/2014 | Amundsen et al. | |
| 8,794,526 B2 | 8/2014 | Wang et al. | |
| 8,798,367 B2 | 8/2014 | Ellis | |
| 8,807,431 B2 | 8/2014 | Wang et al. | |
| 8,807,432 B2 | 8/2014 | Van Horn et al. | |
| 8,820,630 B2 | 9/2014 | Qu et al. | |
| 8,822,848 B2 | 9/2014 | Meagher | |
| 8,824,692 B2 | 9/2014 | Sheerin et al. | |
| 8,824,696 B2 | 9/2014 | Braho | |
| 8,842,849 B2 | 9/2014 | Wahl et al. | |
| 8,844,822 B2 | 9/2014 | Kotlarsky et al. | |
| 8,844,823 B2 | 9/2014 | Fritz et al. | |
| 8,849,019 B2 | 9/2014 | Li et al. | |
| D716,285 S | 10/2014 | Chaney et al. | |
| 8,851,383 B2 | 10/2014 | Yeakley et al. | |

(56) References Cited

U.S. PATENT DOCUMENTS

| | | |
|---|---|---|
| 8,854,633 B2 | 10/2014 | Laffargue |
| 8,866,963 B2 | 10/2014 | Grunow et al. |
| 8,868,421 B2 | 10/2014 | Braho et al. |
| 8,868,519 B2 | 10/2014 | Maloy et al. |
| 8,868,802 B2 | 10/2014 | Barten |
| 8,868,803 B2 | 10/2014 | Caballero |
| 8,870,074 B1 | 10/2014 | Gannon |
| 8,879,639 B2 | 11/2014 | Sauerwein |
| 8,880,426 B2 | 11/2014 | Smith |
| 8,881,983 B2 | 11/2014 | Havens et al. |
| 8,881,987 B2 | 11/2014 | Wang |
| 8,903,172 B2 | 12/2014 | Smith |
| 8,908,995 B2 | 12/2014 | Benos et al. |
| 8,910,870 B2 | 12/2014 | Li et al. |
| 8,910,875 B2 | 12/2014 | Ren et al. |
| 8,914,290 B2 | 12/2014 | Hendrickson et al. |
| 8,914,788 B2 | 12/2014 | Pettinelli et al. |
| 8,915,439 B2 | 12/2014 | Feng et al. |
| 8,915,444 B2 | 12/2014 | Havens et al. |
| 8,916,280 B2* | 12/2014 | Lee ............. H01M 2/1077 429/99 |
| 8,916,789 B2 | 12/2014 | Woodburn |
| 8,918,250 B2 | 12/2014 | Hollifield |
| 8,918,564 B2 | 12/2014 | Caballero |
| 8,925,818 B2 | 1/2015 | Kosecki et al. |
| 8,939,374 B2 | 1/2015 | Jovanovski et al. |
| 8,942,480 B2 | 1/2015 | Ellis |
| 8,944,313 B2 | 2/2015 | Williams et al. |
| 8,944,327 B2 | 2/2015 | Meier et al. |
| 8,944,332 B2 | 2/2015 | Harding et al. |
| 8,950,678 B2 | 2/2015 | Germaine et al. |
| D723,560 S | 3/2015 | Zhou et al. |
| 8,967,468 B2 | 3/2015 | Gomez et al. |
| 8,971,346 B2 | 3/2015 | Sevier |
| 8,976,030 B2 | 3/2015 | Cunningham et al. |
| 8,976,368 B2 | 3/2015 | Akel et al. |
| 8,978,981 B2 | 3/2015 | Guan |
| 8,978,983 B2 | 3/2015 | Bremer et al. |
| 8,978,984 B2 | 3/2015 | Hennick et al. |
| 8,985,456 B2 | 3/2015 | Zhu et al. |
| 8,985,457 B2 | 3/2015 | Soule et al. |
| 8,985,459 B2 | 3/2015 | Kearney et al. |
| 8,985,461 B2 | 3/2015 | Gelay et al. |
| 8,988,578 B2 | 3/2015 | Showering |
| 8,988,590 B2 | 3/2015 | Gillet et al. |
| 8,991,704 B2 | 3/2015 | Hopper et al. |
| 8,996,194 B2 | 3/2015 | Davis et al. |
| 8,996,384 B2 | 3/2015 | Funyak et al. |
| 8,998,091 B2 | 4/2015 | Edmonds et al. |
| 9,002,641 B2 | 4/2015 | Showering |
| 9,007,368 B2 | 4/2015 | Laffargue et al. |
| 9,010,641 B2 | 4/2015 | Qu et al. |
| 9,015,513 B2 | 4/2015 | Murawski et al. |
| 9,016,576 B2 | 4/2015 | Brady et al. |
| D730,357 S | 5/2015 | Fitch et al. |
| 9,022,288 B2 | 5/2015 | Nahill et al. |
| 9,030,964 B2 | 5/2015 | Essinger et al. |
| 9,033,240 B2 | 5/2015 | Smith et al. |
| 9,033,242 B2 | 5/2015 | Gillet et al. |
| 9,036,054 B2 | 5/2015 | Koziol et al. |
| 9,037,344 B2 | 5/2015 | Chamberlin |
| 9,038,911 B2 | 5/2015 | Xian et al. |
| 9,038,915 B2 | 5/2015 | Smith |
| D730,901 S | 6/2015 | Oberpriller et al. |
| D730,902 S | 6/2015 | Fitch et al. |
| D733,112 S | 6/2015 | Chaney et al. |
| 9,047,098 B2 | 6/2015 | Barten |
| 9,047,359 B2 | 6/2015 | Caballero et al. |
| 9,047,420 B2 | 6/2015 | Caballero |
| 9,047,525 B2 | 6/2015 | Barber |
| 9,047,531 B2 | 6/2015 | Showering et al. |
| 9,049,640 B2 | 6/2015 | Wang et al. |
| 9,053,055 B2 | 6/2015 | Caballero |
| 9,053,378 B1 | 6/2015 | Hou et al. |
| 9,053,380 B2 | 6/2015 | Xian et al. |
| 9,057,641 B2 | 6/2015 | Amundsen et al. |
| 9,058,526 B2 | 6/2015 | Powilleit |
| 9,064,165 B2 | 6/2015 | Havens et al. |
| 9,064,167 B2 | 6/2015 | Xian et al. |
| 9,064,168 B2 | 6/2015 | Todeschini et al. |
| 9,064,254 B2 | 6/2015 | Todeschini et al. |
| 9,066,032 B2 | 6/2015 | Wang |
| 9,070,032 B2 | 6/2015 | Corcoran |
| D734,339 S | 7/2015 | Zhou et al. |
| D734,751 S | 7/2015 | Oberpriller et al. |
| 9,082,023 B2 | 7/2015 | Feng et al. |
| 9,224,022 B2 | 12/2015 | Ackley et al. |
| 9,224,027 B2 | 12/2015 | Van Horn et al. |
| D747,321 S | 1/2016 | London et al. |
| 9,230,140 B1 | 1/2016 | Ackley |
| 9,250,712 B1 | 2/2016 | Todeschini |
| 9,258,033 B2 | 2/2016 | Showering |
| 9,262,633 B1 | 2/2016 | Todeschini et al. |
| 9,277,035 B2* | 3/2016 | Sung ............... G06F 1/1679 |
| 9,310,609 B2 | 4/2016 | Rueblinger et al. |
| D757,009 S | 5/2016 | Oberpriller et al. |
| 9,342,724 B2 | 5/2016 | McCloskey |
| 9,375,945 B1 | 6/2016 | Bowles |
| D760,719 S | 7/2016 | Zhou et al. |
| 9,390,596 B1 | 7/2016 | Todeschini |
| D762,604 S | 8/2016 | Fitch et al. |
| D762,647 S | 8/2016 | Fitch et al. |
| 9,412,242 B2 | 8/2016 | Van Horn et al. |
| D766,244 S | 9/2016 | Zhou et al. |
| 9,443,123 B2 | 9/2016 | Hejl |
| 9,443,222 B2 | 9/2016 | Singel et al. |
| 9,478,113 B2 | 10/2016 | Xie et al. |
| 2003/0001395 A1* | 1/2003 | Barthelet ........ E05B 15/0053 292/175 |
| 2003/0022633 A1* | 1/2003 | Chen ............... H04M 1/0262 455/575.1 |
| 2003/0085686 A1* | 5/2003 | Haga ............... H02J 7/0045 320/112 |
| 2004/0214077 A1* | 10/2004 | Huang ............ H01M 2/1066 429/97 |
| 2007/0026297 A1* | 2/2007 | Qin ................ H01M 2/1066 429/97 |
| 2007/0063048 A1 | 3/2007 | Havens et al. |
| 2007/0087263 A1* | 4/2007 | Ge ................. H01M 2/1066 429/97 |
| 2008/0042448 A1* | 2/2008 | Ge ..................... E05C 1/10 292/137 |
| 2009/0134221 A1 | 5/2009 | Zhu et al. |
| 2009/0303668 A1* | 12/2009 | Zhao .............. H01M 2/1066 361/679.01 |
| 2010/0103613 A1* | 4/2010 | Yang ............... G06F 1/1635 361/679.58 |
| 2010/0177076 A1 | 7/2010 | Essinger et al. |
| 2010/0177080 A1 | 7/2010 | Essinger et al. |
| 2010/0177707 A1 | 7/2010 | Essinger et al. |
| 2010/0177749 A1 | 7/2010 | Essinger et al. |
| 2010/0247995 A1* | 9/2010 | Chang ................ E05C 1/16 429/100 |
| 2011/0076536 A1* | 3/2011 | Dong ............... G06F 1/1679 429/97 |
| 2011/0169999 A1 | 7/2011 | Grunow et al. |
| 2011/0202554 A1 | 8/2011 | Powilleit et al. |
| 2012/0039025 A1* | 2/2012 | Chen .............. H01M 2/1022 361/679.01 |
| 2012/0087071 A1* | 4/2012 | Yang ................. E05C 1/04 361/679.01 |
| 2012/0087722 A1* | 4/2012 | Lin ................. H05K 5/0278 403/327 |
| 2012/0111946 A1 | 5/2012 | Golant |
| 2012/0168512 A1 | 7/2012 | Kotlarsky et al. |
| 2012/0193423 A1 | 8/2012 | Samek |
| 2012/0203647 A1 | 8/2012 | Smith |
| 2012/0223141 A1 | 9/2012 | Good et al. |
| 2012/0268900 A1* | 10/2012 | Fan ................ H01M 2/1055 361/747 |
| 2013/0043312 A1 | 2/2013 | Van Horn |
| 2013/0075168 A1 | 3/2013 | Amundsen et al. |
| 2013/0175341 A1 | 7/2013 | Kearney et al. |

(56) References Cited

U.S. PATENT DOCUMENTS

| | | |
|---|---|---|
| 2013/0175343 A1 | 7/2013 | Good |
| 2013/0257744 A1 | 10/2013 | Daghigh et al. |
| 2013/0257759 A1 | 10/2013 | Daghigh |
| 2013/0270346 A1 | 10/2013 | Xian et al. |
| 2013/0287258 A1 | 10/2013 | Kearney |
| 2013/0292475 A1 | 11/2013 | Kotlarsky et al. |
| 2013/0292477 A1 | 11/2013 | Hennick et al. |
| 2013/0293539 A1 | 11/2013 | Hunt et al. |
| 2013/0293540 A1 | 11/2013 | Laffargue et al. |
| 2013/0306728 A1 | 11/2013 | Thuries et al. |
| 2013/0306731 A1 | 11/2013 | Pedraro |
| 2013/0307964 A1 | 11/2013 | Bremer et al. |
| 2013/0308625 A1 | 11/2013 | Park et al. |
| 2013/0313324 A1 | 11/2013 | Koziol et al. |
| 2013/0313325 A1 | 11/2013 | Wilz et al. |
| 2013/0342717 A1 | 12/2013 | Havens et al. |
| 2014/0001267 A1 | 1/2014 | Giordano et al. |
| 2014/0002828 A1 | 1/2014 | Laffargue et al. |
| 2014/0008439 A1 | 1/2014 | Wang |
| 2014/0025584 A1 | 1/2014 | Liu et al. |
| 2014/0034734 A1 | 2/2014 | Sauerwein |
| 2014/0036848 A1 | 2/2014 | Pease et al. |
| 2014/0039693 A1 | 2/2014 | Havens et al. |
| 2014/0042814 A1 | 2/2014 | Kather et al. |
| 2014/0049120 A1 | 2/2014 | Kohtz et al. |
| 2014/0049635 A1 | 2/2014 | Laffargue et al. |
| 2014/0061306 A1 | 3/2014 | Wu et al. |
| 2014/0063289 A1 | 3/2014 | Hussey et al. |
| 2014/0066136 A1 | 3/2014 | Sauerwein et al. |
| 2014/0067692 A1 | 3/2014 | Ye et al. |
| 2014/0070005 A1 | 3/2014 | Nahill et al. |
| 2014/0071840 A1 | 3/2014 | Venancio |
| 2014/0074746 A1 | 3/2014 | Wang |
| 2014/0076974 A1 | 3/2014 | Havens et al. |
| 2014/0078341 A1 | 3/2014 | Havens et al. |
| 2014/0078342 A1 | 3/2014 | Li et al. |
| 2014/0078345 A1 | 3/2014 | Showering |
| 2014/0098792 A1 | 4/2014 | Wang et al. |
| 2014/0100774 A1 | 4/2014 | Showering |
| 2014/0100813 A1 | 4/2014 | Showering |
| 2014/0103115 A1 | 4/2014 | Meier et al. |
| 2014/0104413 A1 | 4/2014 | McCloskey et al. |
| 2014/0104414 A1 | 4/2014 | McCloskey et al. |
| 2014/0104416 A1 | 4/2014 | Giordano et al. |
| 2014/0104451 A1 | 4/2014 | Todeschini et al. |
| 2014/0106594 A1 | 4/2014 | Skvoretz |
| 2014/0106725 A1 | 4/2014 | Sauerwein |
| 2014/0108010 A1 | 4/2014 | Maltseff et al. |
| 2014/0108402 A1 | 4/2014 | Gomez et al. |
| 2014/0108682 A1 | 4/2014 | Caballero |
| 2014/0110485 A1 | 4/2014 | Toa et al. |
| 2014/0114530 A1 | 4/2014 | Fitch et al. |
| 2014/0124577 A1 | 5/2014 | Wang et al. |
| 2014/0124579 A1 | 5/2014 | Ding |
| 2014/0125842 A1 | 5/2014 | Winegar |
| 2014/0125853 A1 | 5/2014 | Wang |
| 2014/0125999 A1 | 5/2014 | Longacre et al. |
| 2014/0129378 A1 | 5/2014 | Richardson |
| 2014/0131438 A1 | 5/2014 | Kearney |
| 2014/0131441 A1 | 5/2014 | Nahill et al. |
| 2014/0131443 A1 | 5/2014 | Smith |
| 2014/0131444 A1 | 5/2014 | Wang |
| 2014/0131445 A1 | 5/2014 | Ding et al. |
| 2014/0131448 A1 | 5/2014 | Xian et al. |
| 2014/0133379 A1 | 5/2014 | Wang et al. |
| 2014/0136208 A1 | 5/2014 | Maltseff et al. |
| 2014/0140585 A1 | 5/2014 | Wang |
| 2014/0151453 A1 | 6/2014 | Meier et al. |
| 2014/0152882 A1 | 6/2014 | Samek et al. |
| 2014/0158770 A1 | 6/2014 | Sevier et al. |
| 2014/0159869 A1 | 6/2014 | Zumsteg et al. |
| 2014/0166755 A1 | 6/2014 | Liu et al. |
| 2014/0166757 A1 | 6/2014 | Smith |
| 2014/0166759 A1 | 6/2014 | Liu et al. |
| 2014/0168787 A1 | 6/2014 | Wang et al. |
| 2014/0175165 A1 | 6/2014 | Havens et al. |
| 2014/0175172 A1 | 6/2014 | Jovanovski et al. |
| 2014/0191644 A1 | 7/2014 | Chaney |
| 2014/0191913 A1 | 7/2014 | Ge et al. |
| 2014/0197238 A1 | 7/2014 | Lui et al. |
| 2014/0197239 A1 | 7/2014 | Havens et al. |
| 2014/0197304 A1 | 7/2014 | Feng et al. |
| 2014/0203087 A1 | 7/2014 | Smith et al. |
| 2014/0204268 A1 | 7/2014 | Grunow et al. |
| 2014/0214631 A1 | 7/2014 | Hansen |
| 2014/0217166 A1 | 8/2014 | Berthiaume et al. |
| 2014/0217180 A1 | 8/2014 | Liu |
| 2014/0231500 A1 | 8/2014 | Ehrhart et al. |
| 2014/0232930 A1 | 8/2014 | Anderson |
| 2014/0247315 A1 | 9/2014 | Marty et al. |
| 2014/0263493 A1 | 9/2014 | Amurgis et al. |
| 2014/0263645 A1 | 9/2014 | Smith et al. |
| 2014/0270196 A1 | 9/2014 | Braho et al. |
| 2014/0270229 A1 | 9/2014 | Braho |
| 2014/0278387 A1 | 9/2014 | DiGregorio |
| 2014/0282210 A1 | 9/2014 | Bianconi |
| 2014/0284384 A1 | 9/2014 | Lu et al. |
| 2014/0288933 A1 | 9/2014 | Braho et al. |
| 2014/0297058 A1 | 10/2014 | Barker et al. |
| 2014/0299665 A1 | 10/2014 | Barber et al. |
| 2014/0312121 A1 | 10/2014 | Lu et al. |
| 2014/0319220 A1 | 10/2014 | Coyle |
| 2014/0319221 A1 | 10/2014 | Oberpriller et al. |
| 2014/0326787 A1 | 11/2014 | Barten |
| 2014/0332590 A1 | 11/2014 | Wang et al. |
| 2014/0344943 A1 | 11/2014 | Todeschini et al. |
| 2014/0346233 A1 | 11/2014 | Liu et al. |
| 2014/0351317 A1 | 11/2014 | Smith et al. |
| 2014/0353373 A1 | 12/2014 | Van Horn et al. |
| 2014/0361073 A1 | 12/2014 | Qu et al. |
| 2014/0361082 A1 | 12/2014 | Xian et al. |
| 2014/0362184 A1 | 12/2014 | Jovanovski et al. |
| 2014/0363015 A1 | 12/2014 | Braho |
| 2014/0369511 A1 | 12/2014 | Sheerin et al. |
| 2014/0370739 A1* | 12/2014 | Lee .................... H01M 2/1066 439/366 |
| 2014/0374483 A1 | 12/2014 | Lu |
| 2014/0374485 A1 | 12/2014 | Xian et al. |
| 2015/0001301 A1 | 1/2015 | Ouyang |
| 2015/0001304 A1 | 1/2015 | Todeschini |
| 2015/0003673 A1 | 1/2015 | Fletcher |
| 2015/0009338 A1 | 1/2015 | Laffargue et al. |
| 2015/0009610 A1 | 1/2015 | London et al. |
| 2015/0014416 A1 | 1/2015 | Kotlarsky et al. |
| 2015/0021397 A1 | 1/2015 | Rueblinger et al. |
| 2015/0028102 A1 | 1/2015 | Ren et al. |
| 2015/0028103 A1 | 1/2015 | Jiang |
| 2015/0028104 A1 | 1/2015 | Ma et al. |
| 2015/0029002 A1 | 1/2015 | Yeakley et al. |
| 2015/0032709 A1 | 1/2015 | Maloy et al. |
| 2015/0039309 A1 | 2/2015 | Braho et al. |
| 2015/0040378 A1 | 2/2015 | Saber et al. |
| 2015/0048168 A1 | 2/2015 | Fritz et al. |
| 2015/0049347 A1 | 2/2015 | Laffargue et al. |
| 2015/0051992 A1 | 2/2015 | Smith |
| 2015/0053766 A1 | 2/2015 | Havens et al. |
| 2015/0053768 A1 | 2/2015 | Wang et al. |
| 2015/0053769 A1 | 2/2015 | Thuries et al. |
| 2015/0062366 A1 | 3/2015 | Liu et al. |
| 2015/0063215 A1 | 3/2015 | Wang |
| 2015/0063676 A1 | 3/2015 | Lloyd et al. |
| 2015/0069130 A1 | 3/2015 | Gannon |
| 2015/0071819 A1 | 3/2015 | Todeschini |
| 2015/0083800 A1 | 3/2015 | Li et al. |
| 2015/0086114 A1 | 3/2015 | Todeschini |
| 2015/0088522 A1 | 3/2015 | Hendrickson et al. |
| 2015/0096872 A1 | 4/2015 | Woodburn |
| 2015/0099557 A1 | 4/2015 | Pettinelli et al. |
| 2015/0100196 A1 | 4/2015 | Hollifield |
| 2015/0102109 A1 | 4/2015 | Huck |
| 2015/0115035 A1 | 4/2015 | Meier et al. |
| 2015/0127791 A1 | 5/2015 | Kosecki et al. |
| 2015/0128116 A1 | 5/2015 | Chen et al. |
| 2015/0129659 A1 | 5/2015 | Feng et al. |

(56) References Cited

U.S. PATENT DOCUMENTS

| | | | |
|---|---|---|---|
| 2015/0133047 A1 | 5/2015 | Smith et al. | |
| 2015/0134470 A1 | 5/2015 | Hejl et al. | |
| 2015/0136851 A1 | 5/2015 | Harding et al. | |
| 2015/0136854 A1 | 5/2015 | Lu et al. | |
| 2015/0142492 A1 | 5/2015 | Kumar | |
| 2015/0144692 A1 | 5/2015 | Hejl | |
| 2015/0144698 A1 | 5/2015 | Teng et al. | |
| 2015/0144701 A1 | 5/2015 | Xian et al. | |
| 2015/0149946 A1 | 5/2015 | Benos et al. | |
| 2015/0161429 A1 | 6/2015 | Xian | |
| 2015/0169925 A1 | 6/2015 | Chen et al. | |
| 2015/0169929 A1 | 6/2015 | Williams et al. | |
| 2015/0186703 A1 | 7/2015 | Chen et al. | |
| 2015/0193644 A1 | 7/2015 | Kearney et al. | |
| 2015/0193645 A1 | 7/2015 | Colavito et al. | |
| 2015/0199957 A1 | 7/2015 | Funyak et al. | |
| 2015/0204671 A1 | 7/2015 | Showering | |
| 2015/0210199 A1 | 7/2015 | Payne | |
| 2015/0220753 A1 | 8/2015 | Zhu et al. | |
| 2015/0254485 A1 | 9/2015 | Feng et al. | |
| 2015/0327012 A1 | 11/2015 | Bian et al. | |
| 2016/0014251 A1 | 1/2016 | Hejl | |
| 2016/0040982 A1 | 2/2016 | Li et al. | |
| 2016/0042241 A1 | 2/2016 | Todeschini | |
| 2016/0057230 A1 | 2/2016 | Todeschini et al. | |
| 2016/0109219 A1 | 4/2016 | Ackley et al. | |
| 2016/0109220 A1 | 4/2016 | Laffargue | |
| 2016/0109224 A1 | 4/2016 | Thuries et al. | |
| 2016/0112631 A1 | 4/2016 | Ackley et al. | |
| 2016/0112643 A1 | 4/2016 | Laffargue et al. | |
| 2016/0124516 A1 | 5/2016 | Schoon et al. | |
| 2016/0125217 A1 | 5/2016 | Todeschini | |
| 2016/0125342 A1 | 5/2016 | Miller et al. | |
| 2016/0125873 A1 | 5/2016 | Braho et al. | |
| 2016/0133253 A1 | 5/2016 | Braho et al. | |
| 2016/0171720 A1 | 6/2016 | Todeschini | |
| 2016/0178479 A1 | 6/2016 | Goldsmith | |
| 2016/0180678 A1 | 6/2016 | Ackley et al. | |
| 2016/0189087 A1 | 6/2016 | Morton et al. | |
| 2016/0227912 A1 | 8/2016 | Oberpriller et al. | |
| 2016/0232891 A1 | 8/2016 | Pecorari | |
| 2016/0292477 A1 | 10/2016 | Bidwell | |
| 2016/0294779 A1 | 10/2016 | Yeakley et al. | |
| 2016/0306769 A1 | 10/2016 | Kohtz et al. | |
| 2016/0314276 A1 | 10/2016 | Wilz, Sr. et al. | |
| 2016/0314294 A1 | 10/2016 | Kubler et al. | |
| 2017/0179448 A1* | 6/2017 | Hsu | H02J 7/0044 |

FOREIGN PATENT DOCUMENTS

| | | |
|---|---|---|
| WO | 2014019130 A1 | 2/2014 |
| WO | 2014110495 A1 | 7/2014 |

OTHER PUBLICATIONS

U.S. Appl. No. 13/367,978, filed Feb. 7, 2012, (Feng et al.); now abandoned.

U.S. Appl. No. 14/277,337 for Multipurpose Optical Reader, filed May 14, 2014 (Jovanovski et al.); 59 pages; now abandoned.

U.S. Appl. No. 14/446,391 for Multifunction Point of Sale Apparatus With Optical Signature Capture filed Jul. 30, 2014 (Good et al.); 37 pages; now abandoned.

U.S. Appl. No. 29/516,892 for Table Computer filed Feb. 6, 2015 (Bidwell et al.); 13 pages.

U.S. Appl. No. 29/523,098 for Handle for a Tablet Computer filed Apr. 7, 2015 (Bidwell et al.); 17 pages.

U.S. Appl. No. 29/528,890 for Mobile Computer Housing filed Jun. 2, 2015 (Fitch et al.); 61 pages.

U.S. Appl. No. 29/526,918 for Charging Base filed May 14, 2015 (Fitch et al.); 10 pages.

U.S. Appl. No. 14/715,916 for Evaluating Image Values filed May 19, 2015 (Ackley); 60 pages.

U.S. Appl. No. 29/525,068 for Tablet Computer With Removable Scanning Device filed Apr. 27, 2015 (Schulte et al.); 19 pages.

U.S. Appl. No. 29/468,118 for an Electronic Device Case, filed Sep. 26, 2013 (Oberpriller et al.); 44 pages.

U.S. Appl. No. 29/530,600 for Cyclone filed Jun. 18, 2015 (Vargo et al); 16 pages.

U.S. Appl. No. 14/707,123 for Application Independent DEX/UCS Interface filed May 8, 2015 (Pape); 47 pages.

U.S. Appl. No. 14/283,282 for Terminal Having Illumination and Focus Control filed May 21, 2014 (Liu et al.); 31 pages; now abandoned.

U.S. Appl. No. 14/705,407 for Method and System to Protect Software-Based Network-Connected Devices From Advanced Persistent Threat filed May 6, 2015 (Hussey et al.); 42 pages.

U.S. Appl. No. 14/704,050 for Intermediate Linear Positioning filed May 5, 2015 (Charpentier et al.); 60 pages.

U.S. Appl. No. 14/705,012 for Hands-Free Human Machine Interface Responsive to a Driver of a Vehicle filed May 6, 2015 (Fitch et al.); 44 pages.

U.S. Appl. No. 14/715,672 for Augumented Reality Enabled Hazard Display filed May 19, 2015 (Venkatesha et al.); 35 pages.

U.S. Appl. No. 14/735,717 for Indicia-Reading Systems Having an Interface With a User's Nervous System filed Jun. 10, 2015 (Todeschini); 39 pages.

U.S. Appl. No. 14/702,110 for System and Method for Regulating Barcode Data Injection Into a Running Application on a Smart Device filed May 1, 2015 (Todeschini et al.); 38 pages.

U.S. Appl. No. 14/747,197 for Optical Pattern Projector filed Jun. 23, 2015 (Thuries et al.); 33 pages.

U.S. Appl. No. 14/702,979 for Tracking Battery Conditions filed May 4, 2015 (Young et al.); 70 pages.

U.S. Appl. No. 29/529,441 for Indicia Reading Device filed Jun. 8, 2015 (Zhou et al.); 14 pages.

U.S. Appl. No. 14/747,490 for Dual-Projector Three-Dimensional Scanner filed Jun. 23, 2015 (Jovanovski et al.); 40 pages.

U.S. Appl. No. 14/740,320 for Tactile Switch for a Mobile Electronic Device filed Jun. 16, 2015 (Bamdringa); 38 pages.

U.S. Appl. No. 14/740,373 for Calibrating a volume Dimensioner filed Jun. 16, 2015 (Ackley et al.); 63 pages.

* cited by examiner

BATTERY COVER LOCKING MECHANISM OF A MOBILE TERMINAL AND METHOD OF MANUFACTURING THE SAME

TECHNICAL FIELD

The present invention relates to a locking mechanism of a back cover of a portable device, and more particularly to a battery cover locking mechanism of a mobile terminal.

BACKGROUND OF THE INVENTION

Mobile terminal devices (e.g., mobile phone, tablet, Personal Digital Assistant (PDA), and remote controller) are more and more into people's work and life to provide much more conveniences for people's work and life. At present, most of the mobile terminals need a battery to power them.

Generally, Industry Mobile Terminal's battery is hard to remove, especially to those need water proof by sealing O-ring, if the battery is too easy to remove, it will easy fail in a drop test.

However, in industrial application, usually the battery may need to be replaced frequently in the field, so we need to design a battery cover locking mechanism which is easy to unlock but could survive the drop test.

SUMMARY OF THE INVENTION

In the embodiments of the present invention, there is provided a locking mechanism in a mobile terminal, comprising a lock button, a slide latch, and an spring member; the slide latch may slide between a first position and a second position, and the slide latch comprises a hole and snaps, the hole is on the top of the slide latch and extends through the slide latch, and the snaps are at the front side of the slide latch; the lock button is in the hole and comprises a press part and a support part, the support part being connected to the press part and extending downward from the press part through the hole to be in contact with the contact part on the spring member; the spring member is fixed with the slide latch and comprises an spring reaction part, a contact part and a protrusion part, the contact part being in contact with the support part of the lock button and a force from the support part causing a spring deformation in the spring reaction part; when an external force is applied to the press part of the lock button to move the lock button downward, the support part transfers the force to the contact part of the spring member so that the contact part applies the force to the spring reaction part to result in a spring deformation, the spring deformation causes the contact part to move, thereby bringing the protrusion part (354) moving to an unblocked position; in a case where the protrusion part is not blocked, the slide latch may slide between the first position and the second position for snapping or unsnapping by the snap.

In a further embodiment of the present invention, there is provided a mobile terminal comprising a back housing, the back housing comprising a back housing body and a battery cover, the locking mechanism according to any one of examples 1-8 is located in one of the back housing body and the battery cover; and a second snap is formed on the other one of the back housing and the battery cover, for snapping with the snap on the slide latch in the locking mechanism to fix the back housing body and the battery cover together.

In still a further embodiment of the present invention, there is provided a method of manufacturing a locking mechanism in a mobile terminal, the locking mechanism comprising a lock button, a slide latch, and spring member, the method comprising: providing the slide latch, the slide latch may slide between a first position and a second position and comprise a hole and snaps, the hole is on the top of the slide latch and extends through the slide latch, and the snaps are at the front side of the slide latch; providing the lock button in the hole, the lock button comprising a press part and a support part, the support part being connected to the press part and extending downward from the press part through the hole to be in contact with the contact part on the spring member; providing the spring member and enabling the spring member to be fixed with the slide latch, the spring member comprising an spring reaction part, a contact part and a protrusion part, the contact part being in contact with the support part of the lock button and a force from the support part causing a spring deformation in the spring reaction part; when an external force is applied to the press part of the lock button to move the lock button downward, the support part transfers the force to the contact part of the spring member so that the contact part applies the force to the spring reaction part to result in a spring deformation, the spring deformation causes the contact part to move, thereby bringing the protrusion part moving to an unblocked position; in a case where the protrusion part is not blocked, the slide latch may slide between the first position and the second position for snapping or unsnapping by the snap.

BRIEF DESCRIPTION OF THE DRAWINGS

Various embodiments in different aspects of the disclosure are illustrated in the drawings for interpreting the principle of the present invention together with the description. It may be appreciated by those skilled in the art that the specific embodiments shown by the drawings are merely illustrative, which are not intended to limit the scope of the present invention. It should be realized that one element in some embodiments may be separated into a plurality of elements, or a plurality of elements may be combined into one element. To describe the illustrative embodiments of the present invention in a greater detail so that those skilled in the art can understand different aspects of the disclosure as well as features and advantageous more thoroughly, now referring to the drawings, wherein.

DETAILED DESCRIPTION OF THE EMBODIMENTS

Some terms are used to indicate particular system components throughout the application document. The terms "comprising", "including" and "having" are used in an open form in the present application document, thus they may be interpreted as "including but not limited to . . . ". In addition, terms "essentially", "substantially" or "approximately" that may be used in the document relate to the tolerance of corresponding terms accepted in the industry.

Many specific details are provided in the following descriptions for the purpose of interpretation to provide a thorough understanding of the present invention. However, it may be apparent to those skilled in the art that the apparatus, method and device of the present invention may be implemented without these specific details. Reference to "embodiment", "example" or similar words in the present description means the specific features, structures or characteristics described in the embodiment or example are included in at least one of the embodiments or examples, but may not be included in other embodiments or examples.

Figure 1:
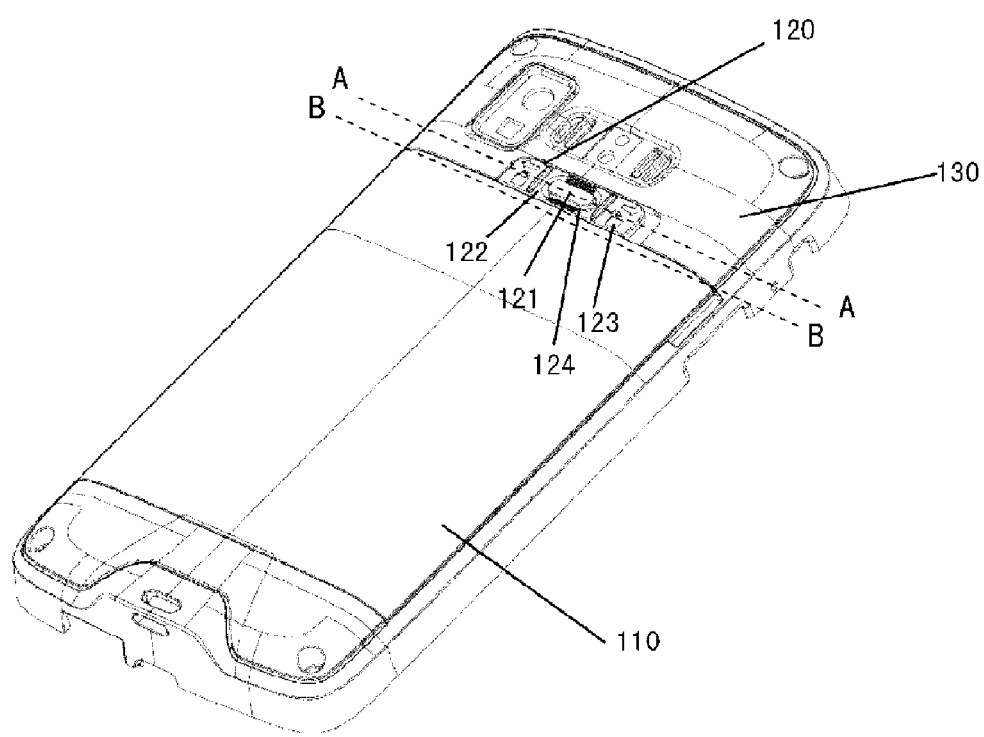
FIG. 1 is a conceptual diagram illustrating the Industry Mobile Terminal's back housing according to the embodiment of the present invention.

FIG. 1 is a conceptual diagram illustrating the Industry Mobile Terminal's back housing according to the embodiment of the present invention. As shown by FIG. 1, the back housing 100 of the Industry Mobile Terminal comprises a back housing body 130 and a battery cover 110. A battery assembly (not shown) is provided below the battery cover 110, or the battery assembly may also be integral with the battery cover together so that the battery assembly may be taken out by detaching the battery cover 110. The back housing body 130 comprises a locking mechanism 120, certainly the back housing body 130 may also comprise various other components such as a camera, a flash lamp, a fingerprint recognition device and the like. Since these components are not closely related to the invention object, no more unnecessary details will be provided here. The battery cover 110 is bonded to the back housing body 130 via the locking mechanism 120.

As shown by FIG. 1, the locking mechanism 120 is provided in the back housing body 130. Optionally, the locking mechanism 120 may also be provided in the battery cover 110. The locking mechanism 120 comprises a lock button 121, a slide latch 122 and an spring member (not shown), which will be described in detail below. The slide latch 122 comprises a hole 124, and the lock button 121 is inserted into the hole 124.

The slide latch 122 may slide leftward to the first position and slide rightward to the second position. When the slide latch 122 is in the first position, the battery cover 110 is snapped with the back housing body 130, and when the slide latch 122 is in the second position, the battery cover 110 is unsnapped with the back housing body 130, so that the battery cover and the battery assembly may be detached by one hand only, as shown by the indicator 123 in FIG. 1. Of course, the snapping position and the unsnapping position may be interchanged, e.g., the first position is the unsnapping position and the second position is the snapping position. The lock button 121 is provided in the hole 124 of the slide latch 122 for locking or unlocking the slide latch 122. For example, if the slide latch 122 is locked by the lock button 121, the slide latch 122 can not slide to the left or right, thereby avoiding loose of the battery cover 110 and the back housing body 130 due to unsnapping them erroneously or undeliberately. For example, the spring member (not shown) may be triggered by pressing the lock button 121 to unlock the slide latch 122 so that the slide latch 122 may slide to the left and right freely. Once the lock button 121 is released, the slide latch 122 will be relocked, which will be described in detail below.

Figure 2:
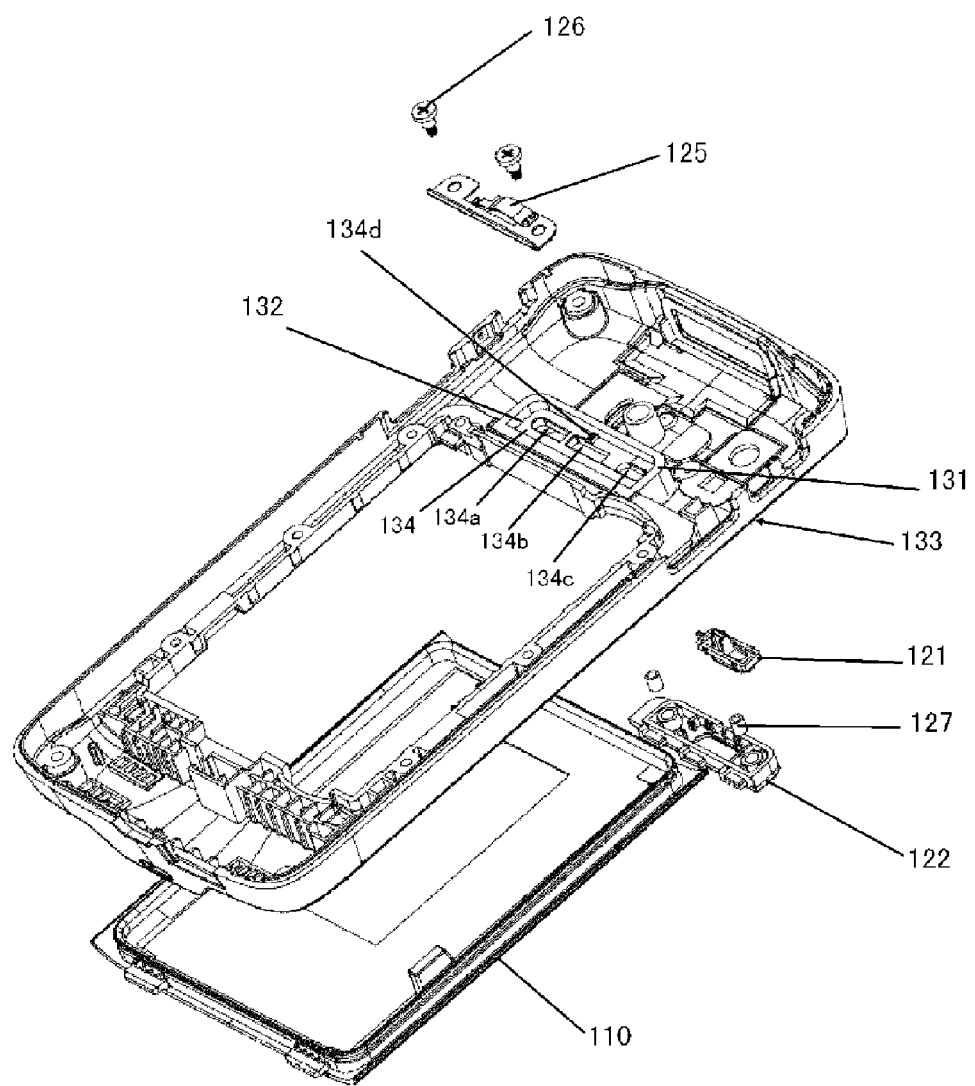
FIG. 2 is an unfolded diagram showing the structure of Industry Mobile Terminal's back housing in FIG. 1 according to the embodiment of the present invention.

FIG. 2 is an unfolded diagram showing the structure of Industry Mobile Terminal's back housing in FIG. 1 according to the embodiment of the present invention. The unfolded diagram of FIG. 2 is a schematic diagram illustrating the structure of FIG. 1 after being turned over. As shown by FIG. 2, the back housing body 130 comprises a mounting part 131 for receiving the locking mechanism 120. The mounting part 131 comprises a first mounting base 133 (not shown in FIG. 2) on a first side of the mounting part and a second mounting base 132 on a second side of the mounting part, wherein the first side and the second side are opposite to each other. The first mounting base 133 is separated from the second mounting base 132 by a partition board 134. As shown by FIG. 2, a protruded block 134d, which cooperates with the spring member 125, is formed on the partition board 134 in the second mounting base, the cooperation principle thereof will be discussed below. Three sliding slots, i.e., a first sliding slot 134a, a second sliding slot 134b and a third sliding slot 134c are further formed on the partition board 134. The three sliding slots extend in a lengthwise direction of the partition board 134 and communicate the first mounting base 133 and the second mounting base 132.

The locking mechanism 120 comprises a lock button 121, a slide latch 122, and an spring member 125. The lock button 121 is mounted on the slide latch 122 through the hole 124, and the lock button 121 and the slide latch 122 are both mounted in the first mounting base 133. The spring member 125 is in the second mounting base 132, and screws 126 and a nuts 127 pass through the first sliding slot 134a and the third sliding slot 134c to fix the spring member 125 with the slide latch 122, so that the slide latch 122 and the spring member 125 may slide along the sliding slot together. The spring member 125 may interact with the block 134d during the sliding, as described in detail by FIG. 3 below. Furthermore, a part (i.e., the support part, see FIG. 3) of the lock button 121 extends through the second sliding slot 134b to be in contact with the spring member 125.

FIGS. 3A-3D are section views of the locking mechanism 120 according to the embodiment of the present invention, the section views are obtained by sectioning along the line A-A as shown by FIG. 1. FIGS. 3A-3D show the unlocking process of the locking mechanism 120.

Figure 3A:
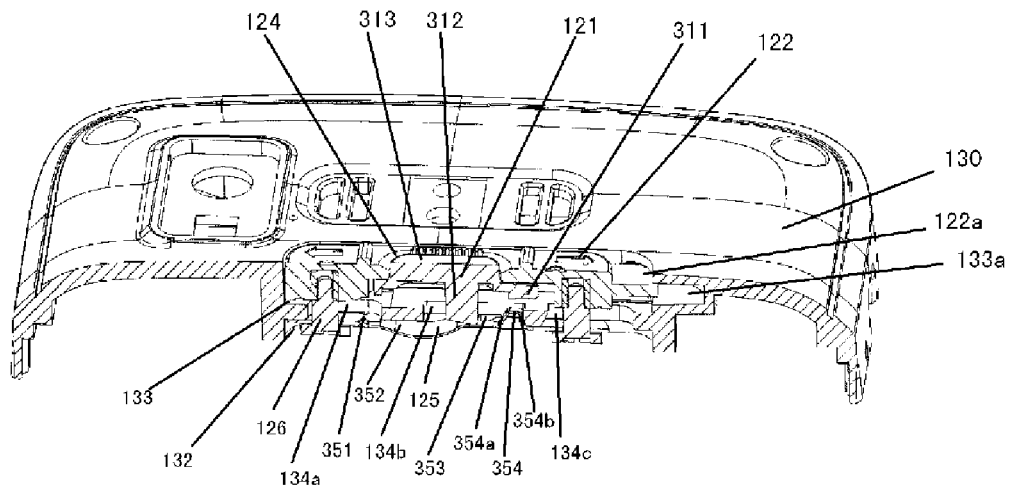
FIGS. 3A-3D are section views of the locking mechanism according to the embodiment of the present invention.

First, referring to FIG. 3A, it depicts the constituting structure of the locking mechanism 120 mounted in the mounting part 131 of the back housing body 130. The locking mechanism 120 comprises a lock button 121, a slide latch 122 and an spring member 125. The lock button 121 is mounted in the hole 124 of the slide latch 122, and both of them are located in the first mounting base 133. The lock button 121 comprises a press part 313, a support part 312 and a fixing part 311. The press part 313 is to be pressed by an operator to perform the action of the lock button. The support part 312 is connected to the press part 313 and extends downward from the press part through the second sliding slot 134b in the partition board 134 (see FIG. 2), the downward extension may be vertical downward, inclined downward or downward in any path (e.g., arc-shape or bending-shape). The support part 312 extends downward to be in contact with the contact part 353 of the spring member 125 located in the second mounting base 132. The fixing part 311 of the lock button is connected to the press part 313 and extends laterally from the bottom of the press part 313, the extending range goes beyond the range of the hole 124 in the slide latch so that the fixing part 311 is blocked by the periphery portion of the hole 124, preventing detachment of the lock button 121 from the hole 124. In another embodiment, the fixing part 311 may also extend laterally from the support part 312, with its extending range going beyond the range of the hole 124 in the slide latch. In still another embodiment, the fixing part 311 may adopt any other suitable structure, so long as it prevents detachment of the lock button 121 from the slide latch 122 and allows up and down movement of the lock button.

The slide latch 122 comprises a hole 124 formed approximately in a middle position thereof for receiving the press part 313 of the latch button 121. The slide latch 122 further comprises a projecting tongue 122a formed at a side in its lengthwise direction, which matches with a lateral slot 133a formed at a side of the first mounting base 133, so that at least a part of said projecting tongue stays in the lateral slot no matter the slide latch 122 slides to the left or to the right.

The spring member 125 comprises a flat part 351, an spring reaction part 352, a contact part 353 and a protrusion part 354. The flat part 351 is located at one end of the spring member 125 and fixed to the bottom of the slide latch 122 by fixing units which pass through the first sliding slot 134a and the third sliding slot 134c (see FIG. 2). The spring reaction part 352 is located between the flat part 351 and the contact part 353. The spring reaction part 352 may include a downward recess part or any other structure that can produce a spring deformation. The contact part 353 contacts the bottom of the support part 312 of the lock button 121 that passes through the second sliding slot 134b (see FIG. 2). In a case where the lock button 121 is not pressed, the contact part provides a certain upward preset spring force to the lock button 121 so that the lock button will not drop down. The protrusion part 354 is formed at one end of the contact part 353, as shown by the FIGURE, the spring reaction part 352 is connected to the other end of the contact part 353. The protrusion part 354 comprises a left side 354a and a right side 354b.

Still referring to FIG. 3A, it shows the situation where the slide latch 122 is locked and can not move to the left or right. As shown in the FIGURE, when the slide latch 122 is locked, the lock button is not pressed down, the spring member 125 receives no force for moving downward from the support part 312, and the protrusion part 354 on the spring member is in its first position. At the first position of the protrusion part 354, the protrusion part 354 is located in the second sliding slot 134b so that right side 354b of the protrusion part is blocked by the right wall of the second sliding slot 134b, resulting in that the slide latch 122 can not move to the right. At this position, the slide latch also can not move to the left since its left side is limited by the left wall of the first mounting base 133.

Furthermore, the block 134d formed on the partition board 134 may also interact with the spring member 125. A gap 353a may be formed in the contact part 353 of the spring member 125. In a case where the lock button 121 is not pressed and no spring deformation of the spring reaction part 352 occurs, the gap is blocked by the block 134d, thereby further preventing the slide latch 122 from moving to the right.

Figure 3B:
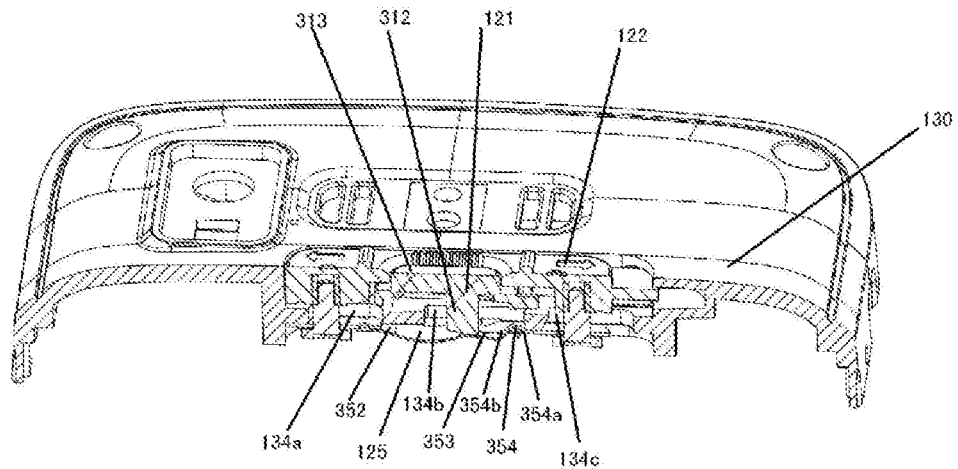

Next, referring to FIG. 3B, an operator presses the press part 313 on the lock button 121 so that the lock button moves downward. The support part 312 of the lock button presses the contact part 353 of the spring member so that the spring reaction part 352 produces a downward spring deformation. The spring deformation brings the contact part 353 and the protrusion part 354 to move downward so that the protrusion part 354 leaves away from the blocking range of the right wall of the second sliding slot 134b, meanwhile the gap 353a of the contact part 353 leaves away from the blocking range of the block 134d. Then, the right wall 354b of the protrusion part is no longer blocked by the block 134d, thus the sliding latch may slide to the right.

Figure 3C:
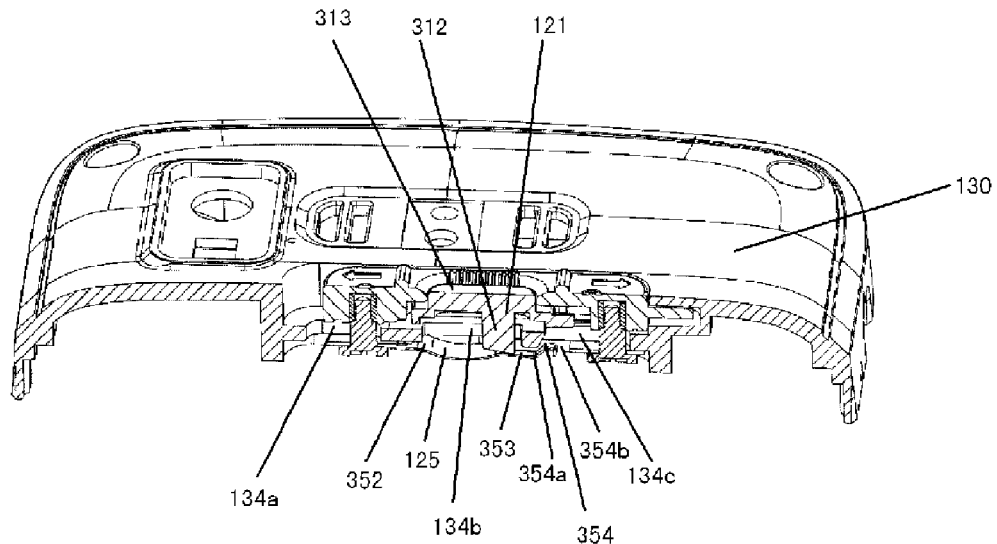

Now referring to FIG. 3C, when the lock button 121 is pressed down, the slide latch 122 and the spring member 125 are pushed a distance toward the right which is sufficient to make the protrusion part 354 on the spring member 125 go beyond the distance between the right wall of the second sliding slot 134b and the left wall of the third sliding slot 134c.

Figure 3D:
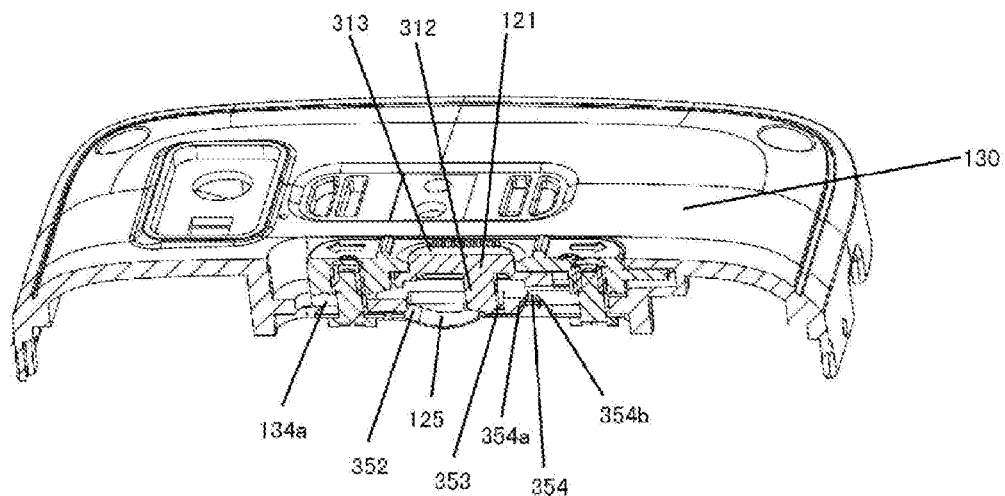

Then referring to FIG. 3D, as shown by FIG. 3C, the slide latch 122 moves a distance to the right to make the protrusion part 354 go beyond the distance between the right wall of the second sliding slot 134b and the left wall of the third sliding slot 134c. Then, the lock button 121 is released to make the spring deformation of the spring member 125 recovered, the contact part and the protrusion part 354 moves upward, thus the protrusion part 354 enters the third sliding slot 134C, at this time the left side 354a of the protrusion part 354 is blocked by the left wall of the third sliding slot 134c, resulting in that the spring member 125 and the slide latch 122 can not move to the left, meanwhile, the slide latch 122 also can not move to the right since its right side is limited by the right wall of the first mounting base 133.

FIGS. 3A-3D describe in detail the process of controlling the sliding latch 122 to slide from left to right by the lock button 121. As to the process of the sliding latch 122 sliding from right to left, it may be easily derived by those skilled in the art according to the foregoing descriptions, no more unnecessary details will be provided here.

Figure 4:
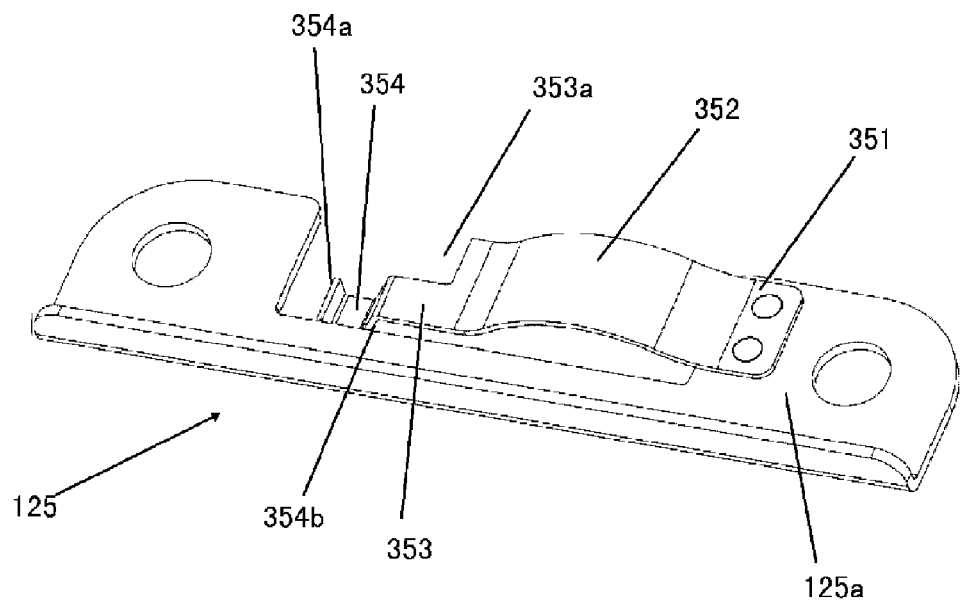
FIG. 4 is a structural diagram of the spring member according to the embodiment of the present invention.

FIG. 4 is a structural diagram of the spring member 125 according to the embodiment of the present invention. As shown by FIG. 4, the spring member 125 may be made of spring sheets such as metal sheet and may comprise a flat part 351, a spring reaction part 352, a contact part 353 and a protrusion part 354. The spring member may further comprise a mounting base 125a, a through hole is formed on the mounting base 125a, the mounting base 125a is mounted on the slide latch 122 by using a screw (126 in FIG. 2) and a nut (127 in FIG. 2) (see FIGS. 3A-D). As shown by FIG. 4, a gap 353a is formed in the contact part 353 of the spring member, the gap 353a interact with the block 134d (see FIG. 2) formed on the partition board 134. For example, when the slide latch 122 is in the first position as shown by FIG. 3 and the lock button 121 is not pressed down, the block 134d blocks the edge of the gap 353a from crossing over the block 134d. When the lock button 121 is pressed down, the spring member is subject to a spring deformation, bringing the edge of the gap 353a moving out of the blocking area of the block 134d.

The mechanism where the slide latch 122 in the locking mechanism 120 slides to the left and right between the first position and the second position is descried in the foregoing paragraphs. How to enable the back housing body 130 to snap or to unsnap with the battery cover 110 by the moving of slide latch 122 to the left and right will be described in detail below.

Figure 5:
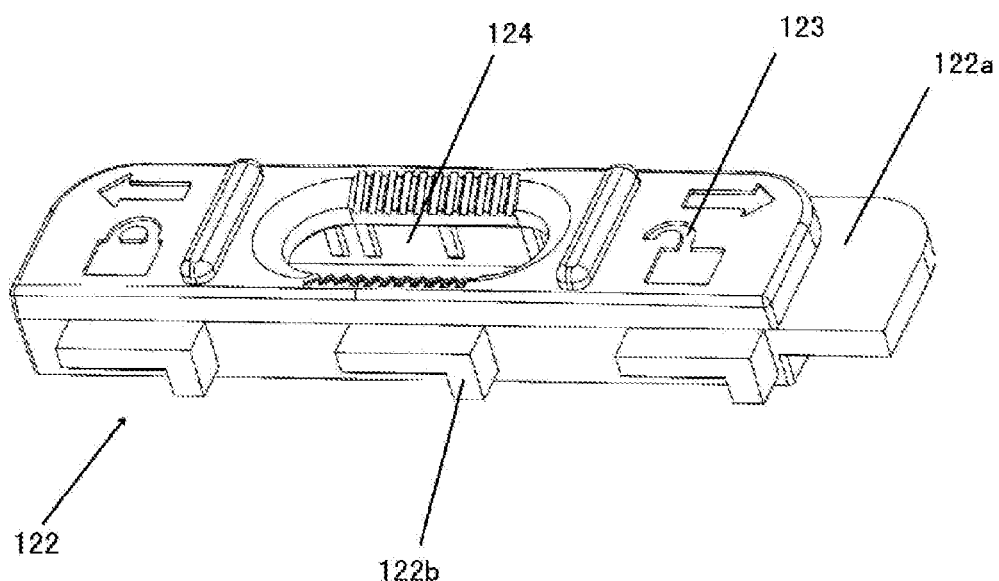
FIG. 5 is a perspective view of the slide latch according to the embodiment of the present invention.

FIG. 5 is a perspective view of the slide latch 122 according to the embodiment of the present invention. As shown by FIG. 5, the slide latch 122 comprises: a hole 124 for receiving the lock button 121, an indicator 123 for indicating a sliding direction and a locking state of the slide latch 122, a projecting tongue 122a formed at a side in the lengthwise direction of the slide latch 122, and a snap 122b formed at the front side of the slide latch. As shown by the FIGURE, the snap comprises a lateral extension part and vertical extension part to form a bending structure. The snap 122b slides to the left and right along with the slide latch thereby to be snapped or unsnapped with another snap on the battery cover 110.

Figure 6:
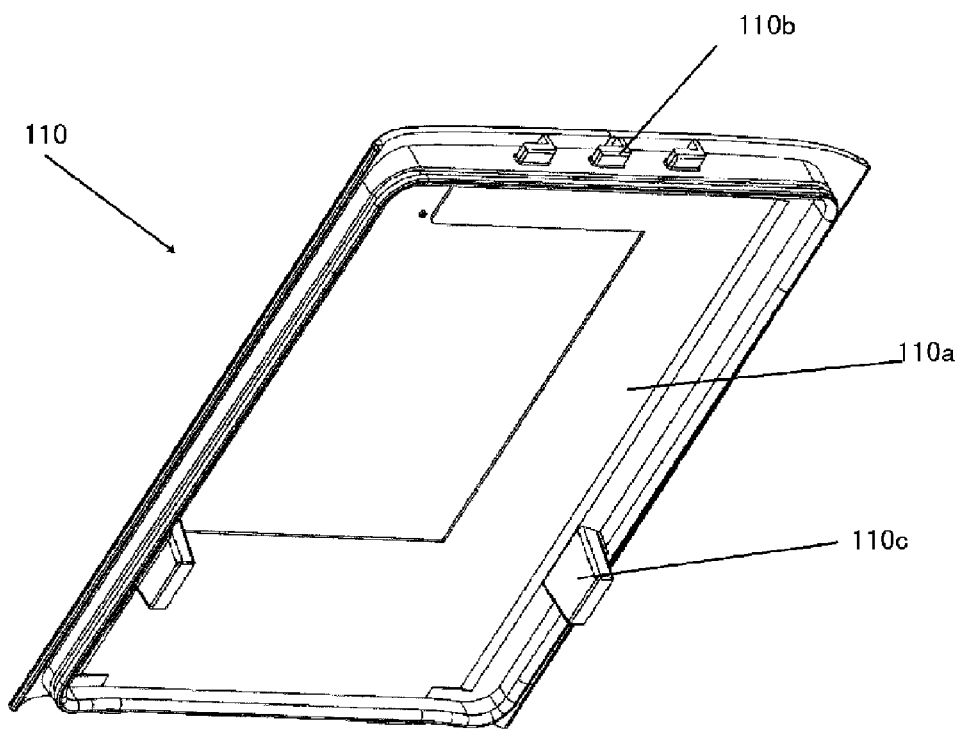
FIG. 6 is a perspective view of the battery cover according to the embodiment of the present invention.

FIG. 6 is a perspective view of the battery cover 110 according to the embodiment of the present invention. As shown by FIG. 6, the battery cover 110 comprises a battery cover body 110a, a second snap 110b on the top of the battery cover 110 and positioning components 110c on both sides of the battery cover body 110a. Optionally, the battery cover 110 may further comprise a battery assembly integral with the battery cover body 110a. Positioning components 110c are used to cooperate with the corresponding components in the back housing body 130 to prevent the battery cover 110 from shifting to the left and right during usage. The second snap 110b is also a bending structure that comprises a lateral extension part and a vertical extension part. The second snap 110b is used to snap with the snap 122b on the slide latch 122 so that the back housing body 130 and the battery cover 110 are snapped together.

Figure 7A:
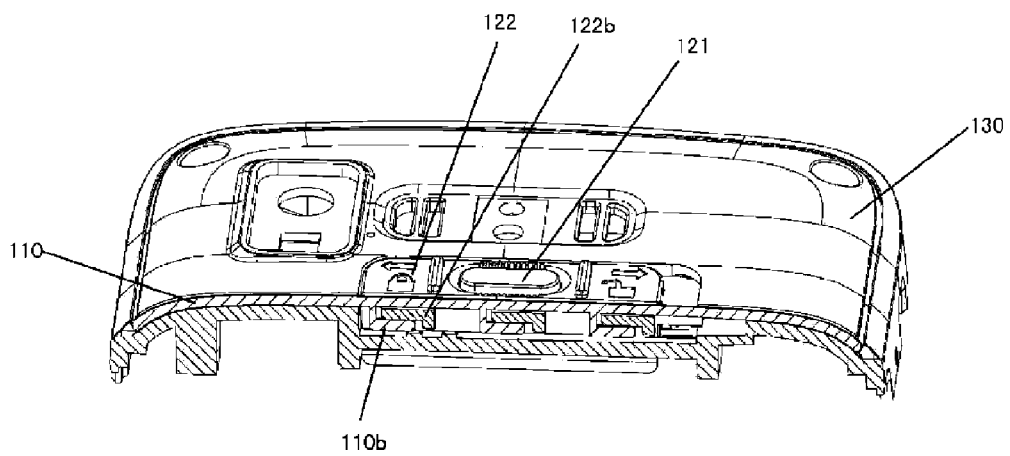
FIGS. 7A-B are section views illustrating the back housing body of the Industry Mobile Terminal snapping with or unsnapping from the battery cover according to the embodiment of the present invention.
Figure 7B:
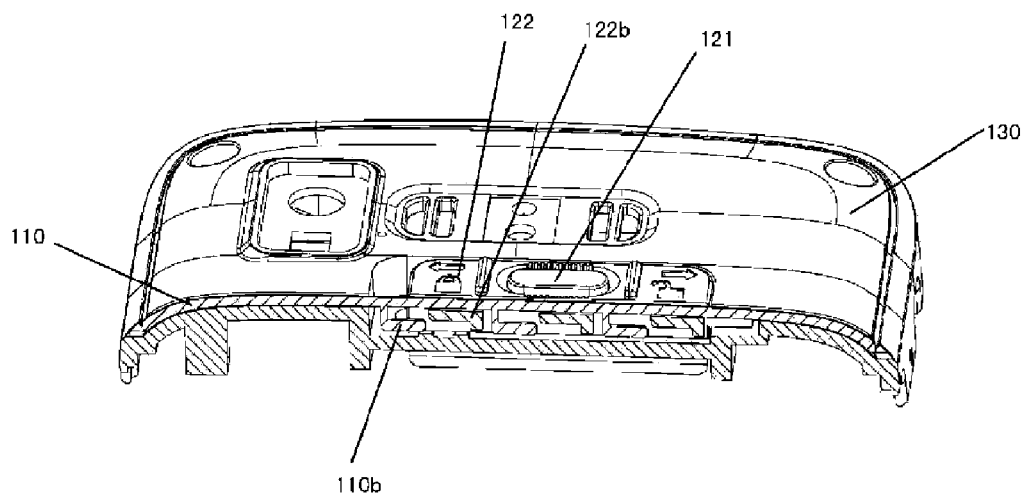

FIGS. 7A-B are section views illustrating the back housing body of the Industry Mobile Terminal snapping with or unsnapping from the battery cover according to the embodiment of the present invention, wherein the section views are obtained by sectioning along the line B-B as shown by FIG. 1.

Referring to FIG. 7A, wherein the slide latch 122 is located at the left side, first position, the snap 122b on the slide latch 122 is snapped with the second snap 110b on the battery cover 110 so that the back housing body 130 of the Industry Mobile Terminal is snapped with the battery cover 110.

Referring to FIG. 7B, wherein the slide latch 122 is located at the right side, second position, the snap 122b on the slide latch 122 is unsnapped from the second snap 110b on the battery cover 110 so that the battery cover 110 and the corresponding battery assembly may be detached from the mobile terminal by one hand only.

Specific examples of the present invention are provided below:

Example 1

A locking mechanism in a mobile terminal, comprising a lock button, a slide latch, and an spring member,
the slide latch may slide between a first position and a second position, and the slide latch comprises a hole and snaps, the hole is on the top of the slide latch and extends through the slide latch, and the snaps are at the front side of the slide latch;
the lock button is in the hole and comprises a press part and a support part, the support part being connected to the press part and extending downward from the press part through the hole to be in contact with the contact part on the spring member;
the spring member is fixed with the slide latch and comprises an spring reaction part, a contact part and a protrusion part, the contact part being in contact with the support part of the lock button and a force from the support part causing a spring deformation in the spring reaction part;
when an external force is applied to the press part of the lock button to move the lock button downward, the support part transfers the force to the contact part of the spring member so that the contact part applies the force to the spring reaction part to result in a spring deformation, the spring deformation causes the contact part to move, thereby bringing the protrusion part (354) moving to an unblocked position;
in a case where the protrusion part is not blocked, the slide latch may slide between the first position and the second position for snapping or unsnapping by the snap.

Example 2

The locking mechanism according to example 1, wherein the press button further comprises a fixing part for preventing detachment of the lock button from the hole.

Example 3

The locking mechanism according to example 1, wherein the spring member is made of elastic spring sheet, and the spring member further comprises a flat part, and the flat part, the spring reaction part, the contact part and the protrusion part are connected in turn.

Example 4

The locking mechanism according to example 1, wherein a partition board is provided between the spring member and the slide latch, when no external force is applied to the press part of the lock button, the protrusion part is blocked by the first side of the first component on the partition board.

Example 5

The locking mechanism according to example 4, wherein when the external force is applied to the press part of the lock button (121), the spring deformation causes the contact part to move downward, thereby bringing the protrusion part (354) moving downward, so that the first side of the protrusion part (354) leaves away from the blocking range of the first side of the first component.

Example 6

The locking mechanism according to example 4, wherein when the first side of the protrusion part leaves away from the blocking range of the first side of the first component, the slide latch is able to slide a distance, then the external force is removed so that the spring deformation of the spring reaction part is recovered, thus the contact part brings the protrusion part to move upward to another position where the second side of the protrusion part is blocked by the second side of the first component.

Example 7

The locking mechanism according to example 4, wherein the partition board further comprises a second component, a gap is further formed in the contact part of the spring member, when the external force is not applied to the press part of the lock button, the edge of the gap is blocked by the second component.

Example 8

The locking mechanism according to example 4, sliding slots are formed on the partition board, the sliding latch and the spring member are fixed together through the sliding slots, and the sliding latch and the spring member can move relative to the sliding slots, the first component on the partition board is a spacer between the two neighboring sliding slots.

Example 9

A mobile terminal comprising a back housing, wherein the back housing comprising a back housing body and a battery cover,
the locking mechanism according to any one of examples 1-8 is located in one of the back housing body and the battery cover; and
a second snap is formed on the other one of the back housing and the battery cover, for snapping with the snap on the slide latch in the locking mechanism to fix the back housing body and the battery cover together.

Example 10

A method of manufacturing a locking mechanism in a mobile terminal, the locking mechanism comprising a lock button, a slide latch, and spring member, the method comprising:
providing the slide latch, the slide latch may slide between a first position and a second position and comprise a hole and snaps, the hole is on the top of the slide latch and extends through the slide latch, and the snaps are at the front side of the slide latch;
providing the lock button in the hole, the lock button comprising a press part and a support part, the support part being connected to the press part and extending downward from the press part through the hole to be in contact with the contact part on the spring member;
providing the spring member and enabling the spring member to be fixed with the slide latch, the spring member comprising an spring reaction part, a contact part and a protrusion part, the contact part being in contact with the support part of the lock button and a force from the support part causing a spring deformation in the spring reaction part; when an external force is applied to the press part of the lock button to move the lock button downward, the support part transfers the force to the contact part of the spring member so that the contact part applies the force to the spring reaction part to result in a spring deformation, the spring deformation causes the contact part to move, thereby bringing the protrusion part moving to an unblocked position;
in a case where the protrusion part is not blocked, the slide latch may slide between the first position and the second position for snapping or unsnapping by the snap.

Although present invention is described with limited embodiments, on account of the above descriptions, it may be appreciated by those skilled in the art that other embodiments may be conceived within the scope of the present invention described herein. It may be acknowledged that for sake of clearness some features of the present invention described in the context in a single embodiment may be further provided in a combined manner in a single embodiment. In contrast, for sake of simplicity the features of the present invention described in the context in a single embodiment may be appropriately further provided separately, in any suitable sub-combination, or in any other embodiment of the present invention. No certain features described in the context in the embodiments shall be regarded as the essential features for the embodiments, except that said embodiments are invalid if without those elements.

What is claimed is:

1. A locking mechanism in a mobile terminal, comprising a lock button, a slide latch, a spring member, and a portion of a back housing body:
the slide latch is configured to be slid between a first position and a second position, and the slide latch comprises a hole and at least one snap, the hole is positioned at a top of the slide latch and extends through the slide latch, the at least one snap is positioned at a front side of the slide latch;
the lock button is in the hole and comprises a press part and a support part, the support part being connected to the press part and extending downward from the press part through the hole to be in contact with a contact part of the spring member;
the spring member is mounted to the slide latch and comprises a spring reaction part, the contact part and a protrusion part;
the protrusion part of the spring is movable between a locked position and an unlocked position, and the protrusion part is biased toward the locked position;
the portion of the back housing body is configured to engage the protrusion part of the spring while the protrusion part is in the locked position, so that the portion of the back housing body restricts the slide latch from sliding between the first position and the second position;
the contact part of the spring being in contact with the support part of the lock button so that when a force is provided from the support part to the contact part a spring deformation occurs in the spring reaction part;
the locking mechanism is configured so that when an external force is applied to the press part of the lock button to move the lock button downward, the support part of the lock button transfers the force to the contact part of the spring member so that the contact part applies the force to the spring reaction part to result in a spring deformation, the spring deformation causes the contact part to move, thereby moving the protrusion part relative to the portion of the back housing body into the unlocked position; and
the locking mechanism is configured so that when the protrusion part is in the unlocked position, the slide latch can be slid between the first position and the second position for engaging or disengaging the at least one snap.

2. The locking mechanism according to claim 1, wherein the press button further comprises a fixing part for preventing detachment of the press button from the hole.

3. The locking mechanism according to claim 1, wherein the spring member is made of a spring sheet, and the spring member further comprises a flat part, and the flat part, the spring reaction part, the contact part and the protrusion part are respectively connected to one another.

4. The locking mechanism according to claim 1, wherein the portion of the back housing body is positioned between the spring member and the slide latch, and the locking mechanism is configured so that when no external force is applied to the press part of the lock button, the protrusion part is blocked by a first side of the the portion of the back housing body.

5. The locking mechanism according to claim 4, wherein the locking mechanism is configured so that when the external force is applied to the press part of the lock button, the spring deformation causes the contact part to move downward, thereby causing the protrusion part to move downward, so that a first side of the protrusion part moves away from blocking range of the first side of the portion of the back housing body.

6. The locking mechanism according to claim 5, wherein the locking mechanism is configured so that when the first side of the protrusion part moves away from the blocking range of the first side of the portion of the back housing body, the slide latch is able to slide a distance, then in response to the external force being removed so that the spring deformation of the spring reaction part is reversed, the contact part causes the protrusion part to move upward to another position where a second side of the protrusion part is blocked by a second side of the portion of the back housing body.

7. The locking mechanism according to claim 4, wherein the portion of the back housing body is a first portion of the back housing body, there is a second portion of the back housing body, a gap is formed in the contact part of the spring member, and the locking mechanism is configured so that when the external force is not applied to the press part of the lock button, an edge of the gap is blocked by the second portion of the back housing body.

8. The locking mechanism according to claim 4, wherein a plurality of sliding slots are defined in the back housing body, the spring member is mounted to the slide latch by fasteners that extend through respective sliding slots of the plurality of sliding slots, and the sliding latch and the spring member can move relative to the plurality of sliding slots, the portion of the back housing body is positioned between two adjacent sliding slots of the plurality of sliding slots.

9. A mobile terminal comprising the back housing body and a battery cover, wherein
  the locking mechanism according to any one of claims 1-8 is located in the back housing body;
  the at least one snap comprises at least one first snap; and
  at least one second snap is formed on the battery cover, for engaging with the at least one first snap on the slide latch of the locking mechanism to fix the back housing body and the battery cover together.

10. A method of manufacturing a locking mechanism in a mobile terminal, the locking mechanism comprising a lock button, a slide latch, a spring member, and a portion of a back housing body, the method comprising:
  providing the slide latch, the slide latch being configured to be slid between a first position and a second position, and the slide latch comprises a hole and at least one snap, the hole is positioned at a top of the slide latch and extends through the slide latch, and the at least one snap is positioned at a front side of the slide latch;
  providing the lock button in the hole, the lock button comprising a press part and a support part, the support part being connected to the press part and extending downward from the press part through the hole to be in contact with a contact part of the spring member; and
  providing the spring member so that
    the spring member is mounted to the slide latch,
    the spring member comprises a spring reaction part, the contact part and a protrusion part,
    the protrusion part of the spring is movable between a locked position and an unlocked position, the protrusion part is biased toward the locked position, the portion of the back housing body is configured to engage the protrusion part of the spring while the protrusion part is in the locked position to restrict the slide latch from sliding between the first position and the second position,
    the contact part of the spring is in contact with the support part of the lock button so that when a force is provided from the support part to the contact part a spring deformation occurs in the spring reaction part;
  wherein the locking mechanism is configured so that when an external force is applied to the press part of the lock button to move the lock button downward, the support part transfers the force to the contact part of the spring member so that the contact part applies the force to the spring reaction part to result in a spring deformation, the spring deformation causes the contact part to move, thereby moving the protrusion part relative to the portion of the back housing body into the unlocked position; and
  wherein the locking mechanism is configured so that when the protrusion part is in the unlocked position, the slide latch can be slid between the first position and the second position for engaging or disengaging the at least one snap.

* * * * *